United States Patent
Chiu (10) Patent No.: US 11,183,502 B1
(45) Date of Patent: Nov. 23, 2021

(54) MEMORY CELL AND METHOD FOR READING OUT DATA THEREFROM

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/997,938

(22) Filed: Aug. 20, 2020

(51) Int. Cl.
| G11C 17/16 | (2006.01) |
| H01L 27/112 | (2006.01) |
| G11C 17/18 | (2006.01) |
| H01L 23/525 | (2006.01) |

(52) U.S. Cl.
CPC ........ *H01L 27/11206* (2013.01); *G11C 17/16* (2013.01); *G11C 17/18* (2013.01); *H01L 23/5252* (2013.01)

(58) Field of Classification Search
CPC .......................... G11C 17/16; H01L 27/11206
USPC .......................................................... 365/96
See application file for complete search history.

(56) References Cited

U.S. PATENT DOCUMENTS

| 10,276,494 | B2* | 4/2019 | Kaemmer | G11C 17/16 |
| 2007/0257331 | A1* | 11/2007 | Kurjanowicz | H01L 27/11206 |
| | | | | 257/530 |
| 2008/0203534 | A1* | 8/2008 | Xu | H01L 27/0259 |
| | | | | 257/577 |
| 2008/0217658 | A1* | 9/2008 | Kim | H01L 27/101 |
| | | | | 257/209 |
| 2009/0184350 | A1* | 7/2009 | Kodama | H01L 27/11206 |
| | | | | 257/296 |
| 2018/0166382 | A1* | 6/2018 | Lee | H01L 29/423 |

* cited by examiner

*Primary Examiner* — Muna A Techane
(74) *Attorney, Agent, or Firm* — CKC & Partners Co., LLC (57) ABSTRACT

A memory cell includes a semiconductor substrate, a transistor, and a first anti-fuse structure. The transistor is above the semiconductor substrate. The first anti-fuse structure is above the semiconductor substrate and adjacent the transistor, and includes a first terminal and a second terminal. The first terminal of the first anti-fuse structure is in the semiconductor substrate and laterally surrounds the transistor. The second terminal of the first anti-fuse structure is above and spaced apart from the first terminal of the first anti-fuse structure.

16 Claims, 5 Drawing Sheets

MEMORY CELL AND METHOD FOR READING OUT DATA THEREFROM

BACKGROUND

Field of Invention

The present disclosure relates to a memory cell and a method for reading out data from the memory cell.

Description of Related Art

Fuse elements are commonly used in semiconductor devices, such as memory or logic devices. Anti-fuses have electrical characteristics opposite to those of fuses and may be used for the repair of defective cells by swapping the defective cells with redundant cells.

In general, one anti-fuse is controlled by one control gate adjacent thereto. Therefore, a unit cell is defined as 1T1C, which refers to a structure including a combination of one transistor (control gate) and one capacitor (anti-fuse). However, as a number of anti-fuse needed in the semiconductor device increases, multiple unit cells tend to occupy a large area. In order to achieve a high density semiconductor device, a size of the unit cell is desired to be as small as possible.

SUMMARY

The present disclosure relates in general to a memory cell and a method for reading out data from the memory cell.

According to some embodiments of the present disclosure, the memory cell includes a semiconductor substrate, a transistor, and a first anti-fuse structure. The transistor is above the semiconductor substrate. The first anti-fuse structure is above the semiconductor substrate and adjacent the transistor, and includes a first terminal and a second terminal. The first terminal of the first anti-fuse structure is in the semiconductor substrate and laterally surrounds the transistor. The second terminal of the first anti-fuse structure is above and spaced apart from the first terminal of the first anti-fuse structure.

In some embodiments of the present disclosure, a dielectric layer is between the first terminal and the second terminal of the first anti-fuse structure.

In some embodiments of the present disclosure, a distance between a top surface of the first terminal and a bottom surface of the second terminal is between about 15 Å and about 30 Å.

In some embodiments of the present disclosure, the memory cell further includes an isolation structure laterally surrounding the transistor.

In some embodiments of the present disclosure, the isolation structure is in contact with the first terminal of the first anti-fuse structure and one of a source and a drain of the transistor.

In some embodiments of the present disclosure, the first terminal of the first anti-fuse structure laterally surrounds the isolation structure.

In some embodiments of the present disclosure, the memory cell further includes a well region in the semiconductor substrate, in which the well region is in contact with the first terminal of the first anti-fuse structure and a channel of the transistor.

In some embodiments of the present disclosure, a top surface of the first terminal of the first anti-fuse structure is lower than a top surface of a gate of the transistor.

In some embodiments of the present disclosure, a bottom surface of the second terminal of the first anti-fuse structure is lower than a top surface of a gate of the transistor.

In some embodiments of the present disclosure, the memory cell further includes a contact interconnecting a gate and a drain of the transistor.

In some embodiments of the present disclosure, the memory cell further includes a first doping region in the semiconductor substrate and laterally surrounding the first terminal of the first anti-fuse structure, and the first doping region is spaced apart from the first terminal of the first anti-fuse structure.

In some embodiments of the present disclosure, the first doping region has a conductivity type the same as a conductivity type of the first terminal of the first anti-fuse structure.

In some embodiments of the present disclosure, the memory cell further includes a second doping region in the semiconductor substrate and laterally surrounding the first doping region, and the first doping region has a conductivity type different from a conductivity type of the second doping region.

In some embodiments of the present disclosure, the memory cell further includes a second anti-fuse structure above the semiconductor substrate and adjacent to the transistor, in which the first and second anti-fuse structures share the first terminal.

In some embodiments of the present disclosure, the second anti-fuse structure further includes a second terminal above the first terminal, and the second terminals of the first and second anti-fuse structures are spaced apart from each other.

In some embodiments of the present disclosure, the first terminal of the first anti-fuse structure is ring-shaped in a top view.

According to some embodiments of the present disclosure, the method for reading out data from a memory cell, in which the memory cell includes a transistor and at least one anti-fuse structure formed above a semiconductor substrate, and a well region in the semiconductor substrate is connected to a channel of the transistor and a first terminal of the anti-fuse structure, and the method includes: providing a first voltage to a source and a drain of the transistor; providing a second voltage to a first terminal and a second terminal of the anti-fuse structure; and determining a state of the anti-fuse structure by detecting a current flowing through a channel of the transistor.

In the aforementioned embodiments of the present disclosure, since the first anti-fuse structure can be configured as a capacitor of the memory cell, and the first terminal of the first anti-fuse structure can be disposed in the semiconductor substrate, a size of the memory cell can be decreased, and a number of the capacitors in a single semiconductor device (e.g., a memory device with multiple memory cells) can be increased without occupying a large area. Accordingly, a high density semiconductor device can be achieved.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Figure 1:
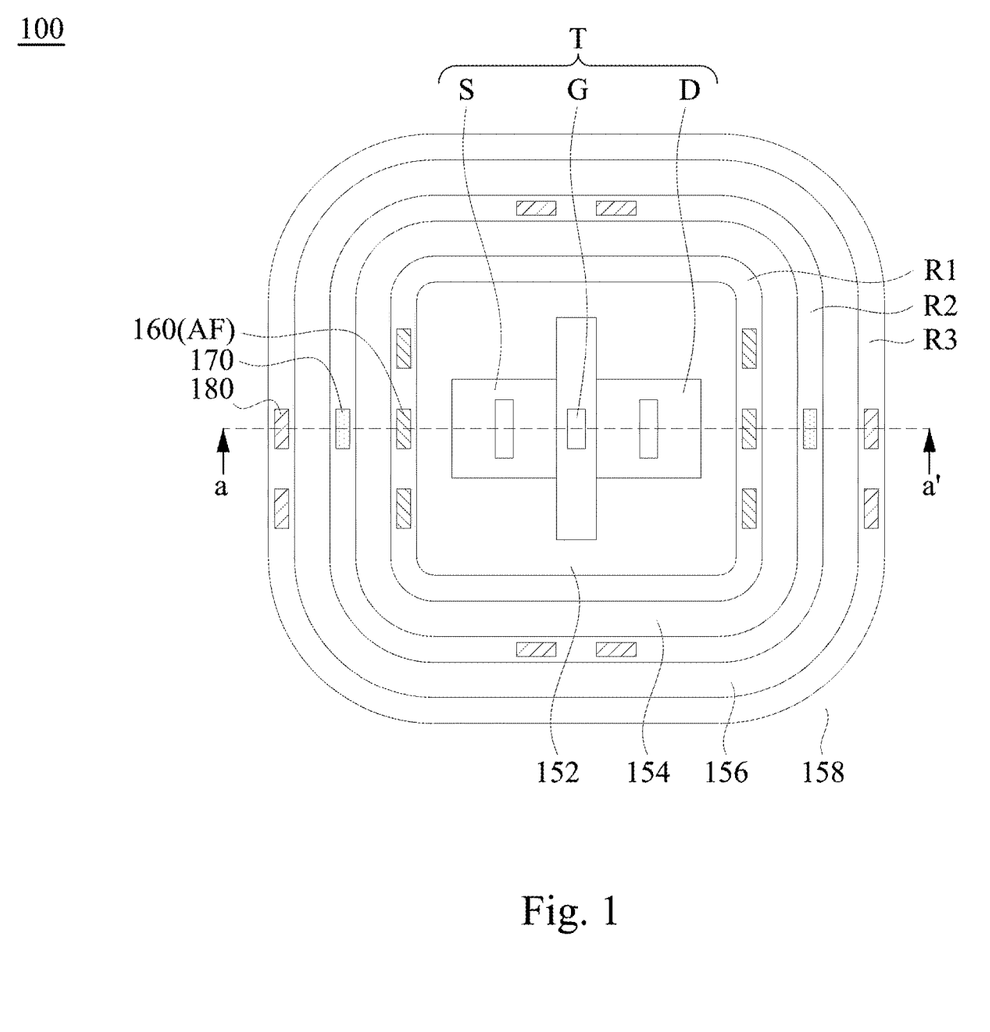
FIG. 1 is a top view illustrating a memory cell according to some embodiments of the present disclosure.

FIG. 1 is a top view illustrating a memory cell 100 according to some embodiments of the present disclosure. Reference is made to FIG. 1. The memory cell 100 includes a transistor T, a first ring area R1, a second ring area R2, and a third ring area R3. The first ring area R1 laterally surrounds the transistor T, the second ring area R2 laterally surrounds first ring area R1, and the third ring area R3 laterally surrounds the second ring area R2. In some embodiments, the transistor T is substantially located at a center of the memory cell 100 from a top view. In some embodiments, the first ring area R1, the second ring area R2, and the third ring area R3 are laterally spaced apart from each other. The transistor T includes a gate structure G, a source region S, and a drain region D to maintain the operation of the memory cell 100. At least one anti-fuse structure AF is formed in the first ring area R1 and configured as a capacitor of the memory cell 100. The second ring area R2 and the third ring area R3 are configured to maintain the operation of the memory cell 100.

Figure 2:
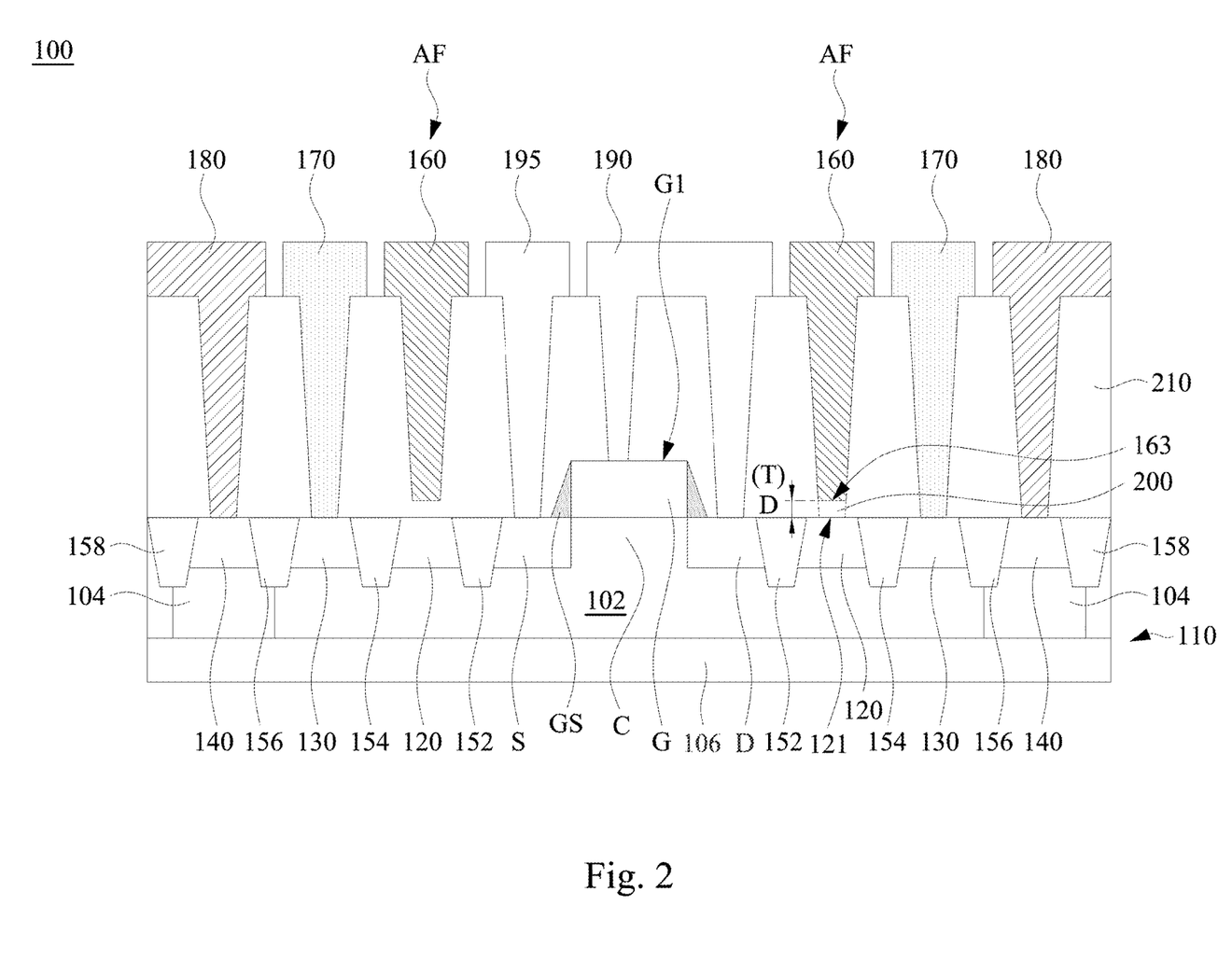
FIG. 2 is a cross-sectional view of the memory cell shown in FIG. 1 along line a-a' according to some embodiments.

FIG. 2 is a cross-sectional view of the memory cell 100 shown in FIG. 1 along line a-a' according to some embodiments. Reference is made to FIG. 2. The memory cell 100 includes a semiconductor substrate 110, at least one first doping region 130, at least one second doping region 140, and at least one third doping region 120. The transistor T and the anti-fuse structure AF are above the semiconductor substrate 110, and the anti-fuse structure AF is adjacent to the transistor T. The source region S, the drain region D, a channel region C between the source region S and the drain region D, the first doping region 130, the second doping region 140, and the third doping region 120 are within the semiconductor substrate 110, and the gate structure G is over the semiconductor substrate 110. In some embodiments, a gate spacer GS may laterally surround the gate structure G. In some embodiments, the gate structure G may include conductive materials such as metal or other suitable materials, and the gate spacer GS may include dielectric materials such as silicon oxide, silicon nitride, or other suitable materials. In some embodiments, the third doping region 120 laterally surrounds the transistor T such that the third doping region 120 forms the first ring area R1 shown in FIG. 1. In some embodiments, the first doping region 130 laterally surrounds the third doping region 120 such that the first doping region 130 forms the second ring area R2 shown in FIG. 1. In some embodiments, the second doping region 140 laterally surrounds the first doping region 130 such that the second doping region 140 forms the third ring area R3 shown in FIG. 1. In other words, the first doping region 130, the second doping region 140, and the third doping region 120 are respectively ring-shaped in a top view.

Reference is made to FIG. 1 and FIG. 2. In some embodiments, the source region S, the drain region D, and the second doping region 140 are doped with n-type dopants such as arsenic or phosphorous, and the third doping region 120 and the first doping region 130 are doped with p-type dopants such as boron. In alternative embodiments, the source region S, the drain region D, and the second doping region 140 are doped with p-type dopants such as boron, and the third doping region 120 and the first doping region 130 are doped with n-type dopants such as arsenic or phosphorous. The memory cell 100 may further include a plurality of isolation structures 152, 154, 156, and 158 embedded in the semiconductor substrate 110 to isolate the source/drain region S, D, the third doping region 120, the first doping region 130, and the second doping region 140, such that the source/drain region S, D, the third doping region 120, the first doping region 130, and the second doping region 140 are spaced apart from each other and electrically isolated from each other. For example, the isolation structure 152 laterally surrounds the transistor T, the third doping region 120 laterally surrounds the isolation structure 152, the isolation structure 154 laterally surrounds the third doping region 120, the first doping region 130 laterally surrounds the isolation structure 154, the isolation structure 156 laterally surrounds the first doping region 130, the second doping region 140 laterally surrounds the isolation structure 156, and the isolation structure 158 laterally surrounds the second doping region 140. In some embodiments, the isolation structure 152 is in contact with the third doping region 120 and one of the source region S and drain region D of the transistor T. In some embodiments, the isolation structures 152, 154, 156, and 158 are shallow trench isolation (STI) structures including dielectric materials, which may be silicon oxide, silicon nitride, or other suitable materials.

The memory cell 100 further includes a first well region 102 and a second well region 104 in the semiconductor substrate 110. The second well region 104 may surround the first well region 102. The source region S, the drain region D, the channel region C, the third doping region 120, and the first doping region 130 are within the first well region 102, and the second doping region 140 is within the second well region 104. In some embodiments, the first well region 102 has a conductivity type the same as the third doping region 120 and the first doping region 130, and the second well region 104 has a conductivity type the same as the second doping region 140. In some embodiments, the first well region 102 may be in contact with the third doping region 120 and the channel region C of the transistor T. In some embodiments, the memory cell 100 further includes a deep well region 106 below the first well region 102 and the second well region 104. The deep well region 106 may have a conductivity type the same as the second well region 104. The deep well region 106 functions to electrically isolate the semiconductor substrate 110.

The memory cell 100 further includes at least one first conductive contact 160, at least one second conductive contact 170, at least one third conductive contact 180, at least one fourth conductive contact 190, and at least one fifth conductive contact 195. The second conductive contact 170, the third conductive contact 180, the fourth conductive contact 190, and the fifth conductive contact 195 will be discussed first hereinafter for clarity. The second conductive contact 170 is formed on the first doping region 130 and in contact with the first doping region 130, such that the second conductive contact 170 is electrically connected to the first doping region 130. The second conductive contact 170 may be referred to be a pick-up contact that interconnects the first doping region 130 and a signal line formed thereon. In some embodiments, the second conductive contact 170 is electrically connected to a signal source through the connected signal line, such that a desired voltage potential can be provided to the semiconductor substrate 110. On the other hand, the third conductive contact 180 is formed on the second doping region 140 and in contact with the second doping region 140, such that the third conductive contact 180 is electrically connected to the second doping region 140. The third conductive contact 180 may be referred to be a pick-up contact that interconnects the second doping region 140 and a power line formed thereon. In some embodiments, the third conductive contact 180 is electrically connected to a power source (e.g., the Vdd source) through the connected power line, such that the operation of the memory cell 100 can be maintained. In addition, the fourth conductive contact 190 and the fifth conductive contact 195 are formed on the transistor T and in contact with the transistor T, such that the fourth conductive contact 190 and the fifth conductive contact 195 are electrically connected to the transistor T. In some embodiments, the fourth conductive contact 190 is in contact with the gate structure G and the drain region D of the transistor T and electrically connected to the power source (e.g., the Vdd source), while the fifth conductive contact 195 is in contact with the source region S of the transistor T and electrically connected to a ground reference. In other words, the fourth conductive contact 190 may interconnects the gate structure G and the drain region D of the transistor T and electrically connected to the power source. Accordingly, the operation of the memory cell 100 can be maintained.

The first conductive contact 160 is formed on the third doping region 120 and vertically spaced apart from the third doping region 120, such that the third doping region 120 and the first conductive contact 160 can be electrically isolated from each other and configured as the anti-fuse structure AF mentioned above. In other words, the anti-fuse structure AF includes the third doping region 120 and the first conductive contact 160 vertically spaced apart from each other. The third doping region 120 can be configured as a bottom electrode (or a first terminal) of the anti-fuse structure AF, and the first conductive contact 160 can be configured as a top electrode (or a second terminal) of the anti-fuse structure AF. Furthermore, the anti-fuse structure AF including the third doping region 120 and the first conductive contact 160 can be partially embedded in the semiconductor substrate 110. That is, a portion of the anti-fuse structure AF (e.g., the thirddoping region 120 of the anti-fuse structure AF) can be embedded in the semiconductor substrate 110. For example, in FIG. 2, the bottom electrode (i.e., the third doping region 120) of the anti-fuse structure AF is embedded in the semiconductor substrate 110 while the top electrode (i.e., the first conductive contact 160) of the anti-fuse structure AF is above the semiconductor substrate 110. In some embodiments, a plurality of the first conductive contacts 160 are disposed on the third doping region 120 and around the transistor T. In some embodiments, the first conductive contact 160, the second conductive contact 170, the third conductive contact 180, the fourth conductive contact 190, and the fifth conductive contact 195 may include conductive materials, such as copper, tungsten, or other suitable materials.

In some embodiments, the anti-fuse structure AF further includes a dielectric layer 200 vertically sandwiched between the third doping region 120 and the first conductive contact 160. That is, the third doping region 120 and the first conductive contact 160 are on opposite sides of the dielectric layer 200. In some embodiments, a thickness T of the dielectric layer 200 is between about 15 Å and about 30 Å. That is, a distance D between a top surface 121 of the third doping region 120 and a bottom surface 163 of the first conductive contact 160 is between about 15 Å and about 30 Å. If the thickness T of the dielectric layer 200 is smaller than about 15 Å, the anti-fuse structure AF is easy to be programmed, and the states "0" and "1" may not be distinguishable; if the thickness T of the dielectric layer 200 is greater than about 30 Å, a voltage configured to blow out the anti-fuse structure AF is increased. In some embodiments, a top surface 121 of the third doping region 120 is lower than a top surface G1 of the gate structure G of the transistor T. In some embodiments, a bottom surface 163 of the first conductive contact 160 is lower than the top surface G1 of the gate structure G of the transistor T. The operation of the anti-fuse structure AF and its influence to the memory cell 100 will be discussed later in the following descriptions.

In some embodiments, the memory cell 100 further includes an interlayer dielectric layer 210 overlying the semiconductor substrate 110 and covering the transistor T, the first doping region 130, the second doping region 140, the third doping region 120, and the isolation structures 152, 154, 156, and 158. In addition, the interlayer dielectric layer 210 is interposed between the first conductive contact 160, the second conductive contact 170, the third conductive contact 180, the fourth conductive contact 190, and the fifth conductive contact 195, so as to prevent the first conductive contact 160, the second conductive contact 170, the third conductive contact 180, the fourth conductive contact 190, and the fifth conductive contact 195 from being accidentally in contact with each other. In some embodiments, the interlayer dielectric layer 210 may include dielectric materials, which may be silicon oxide, silicon nitride, or other suitable materials.

In some embodiments, the interlayer dielectric layer 210 and the dielectric layer 200 between the third doping region 120 and the first conductive contact 160 may be substantially formed without an interface therebetween. For example, the interlayer dielectric layer 210 is formed above the semiconductor substrate 110. A blind hole, which does not expose the third doping region 120, is formed in the interlayer dielectric layer 210. The first conductive contact 160 is then formed in the blind hole, such that a portion of the interlayer dielectric layer 210 between the third doping region 120 and the first conductive contact 160 is referred to as the dielectric layer 200.

In some embodiments, the memory cell 100 further includes a plurality of anti-fuse structures AF above the semiconductor substrate 110 and adjacent to the transistor T. The anti-fuse structures AF share the first terminal (i.e., the third doping region 120) and each includes one second terminal (i.e., one first conductive contact 160) above the first terminal. In some embodiments, the second terminals of the anti-fuse structures AF are spaced apart from each other as shown in FIG. 1. Since anti-fuse structures AF share the same first terminal, the anti-fuse structures AF can be formed along the first ring area R1 with a high density.

Since the third doping region 120, the first conductive contact 160, and the dielectric layer 200 therebetween can be configured as the capacitor (i.e., the anti-fuse structure AF) of the memory cell 100, a size of the memory cell 100 can be decreased, and a number of the capacitors in a single semiconductor device (e.g., a memory device with multiple memory cells 100) can be increased without occupying a large area. Accordingly, a high density semiconductor device can be achieved. It is noted that the connection relationships, the materials, and the advantages of the elements described above will not be repeated. In the following descriptions, methods for writing data into the memory cell 100 and reading out data from the memory cell 100 will be discussed.

Figure 3:
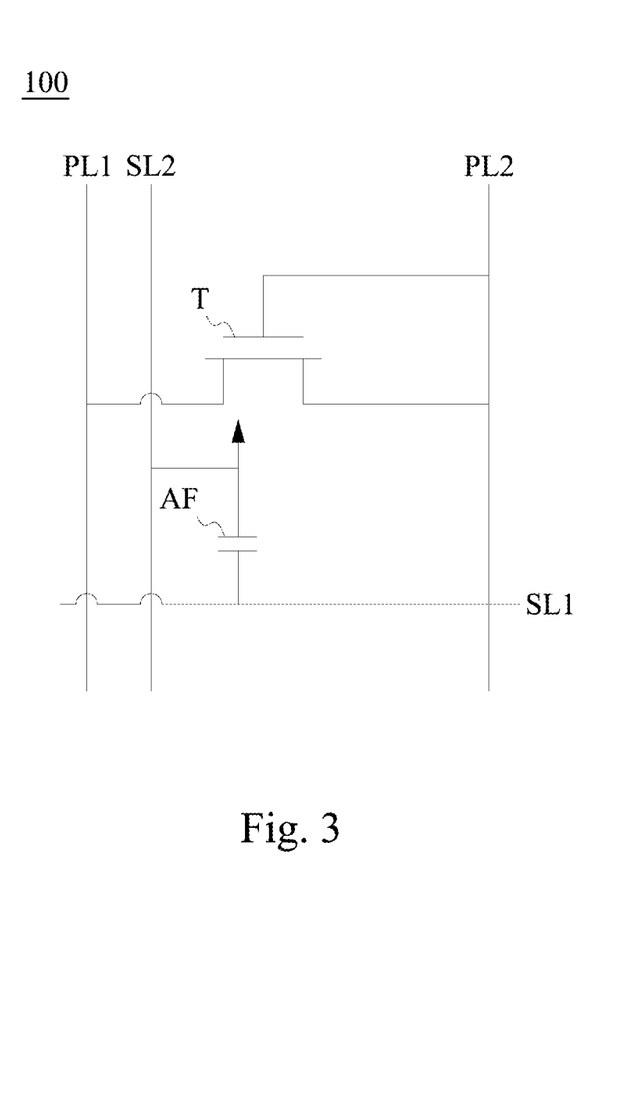
FIG. 3 is a layout of the memory cell shown in FIG. 1 according to some embodiments of the present disclosure.

FIG. 3 is a layout of the memory cell 100 shown in FIG. 1 according to some embodiments of the present disclosure. Reference is made to FIG. 2 and FIG. 3. A source of the transistor T (e.g., the source region S) is electrically connected to the ground reference through a first power line PL1, and a drain of the transistor T (e.g., the drain region D) is electrically connected to the Vdd power source through a second power line PL2. Accordingly, current can flow through the channel region C (see FIG. 2) of the transistor T. In some embodiments, a gate (e.g., the gate structure G) of the transistor T is also electrically connected to the Vdd power source through the second power line PL2. On the other hand, the second terminal of the anti-fuse structure AF (e.g., the first conductive contact 160) is electrically connected to a first signal line SL1, and the first terminal of the anti-fuse structure AF (e.g., the doping region 120) is electrically connected to a second signal line SL2. In some embodiments, the first terminal of the anti-fuse structure AF is electrically connected to a second signal line SL2 through the first doping region 130 and the second conductive contact 170. In some embodiments, the power lines PL1, PL2 and the second signal line SL2 are substantially parallel to each other, and the first signal line SL1 is substantially perpendicular to the power lines PL1, PL2 and the second signal line SL2.

A first voltage potential and a second voltage potential can be respectively provided through the first signal line SL1 and the second signal line SL2 to the anti-fuse structure AF. When a voltage difference between the first voltage potential and the second voltage potential is greater than a break down voltage (e.g., about 3V) of the anti-fuse structure AF, the anti-fuse structure AF will be blown out, such that a current between the first terminal and the second terminal of the anti-fuse structure AF is changed, and data is written into the memory cell 100. For example, the first and second terminals are short (e.g., at the state 1) in an anti-fuse structure AF which is blown out, and the first and second terminals are open (e.g., at the state 0) in an anti-fuse structure AF which is not blown out.

In addition, the condition of the transistor T will not affect the writing of the data. In some embodiments, when the data is being written into the memory cell 100, the transistor T can be under an operating condition, that is, the source region S being electrically connected to the ground reference, and the drain region D and the gate structure G being electrically connected to the Vdd power source. In alternative embodiments, when the data is being written into the memory cell 100, the transistor T can be under a non-operating condition, that is, the source region S, the drain region D and the gate structure G being electrically connected to a floating node, such that cost of maintaining the operation of the transistor T can be saved.

After the data is written into the memory cell 100, the data can be read out from the memory cell 100 by determining whether the anti-fuse structure AF is blown out. More specifically, after the anti-fuse structure AF is blown out, a first voltage difference is provided to the anti-fuse structure AF by providing a third voltage potential and a fourth voltage potential thereto, and a second voltage difference is provided to the transistor T by providing a fifth voltage potential and a sixth voltage potential thereto. If the anti-fuse structure AF is blown out, the anti-fuse structure AF is short across the first and second terminals thereof, and a first current flows through the anti-fuse structure AF to the semiconductor substrate 110. In the meantime, a second current flows through the channel region C of the transistor T. The first current of the anti-fuse structure AF thus affects the second current flowing through the channel region C through the first well region 102 of the semiconductor substrate 110. As a result, the second current generated by the transistor T may drop due to the first current, and this phenomenon is called "the body effect". On the other hand, if the anti-fuse structure AF is not blown out, the anti-fuse structure AF is open across the first and second terminals thereof, and there is no current flowing through the anti-fuse structure AF to the semiconductor substrate 110 when the voltage potentials are applied to the anti-fuse structure AF. As a result, the second current generated by the transistor T maintains the same under this situation.

Since the second current generated by the transistor T will drop after the anti-fuse structure AF is blown out, the blowing out of the anti-fuse structure AF can be easily determined. In some embodiments, the third voltage potential and the fourth voltage potential may be respectively provided to the second terminal and the first terminal of the anti-fuse structure AF through the first signal line SL1 and the second signal line SL2, and the fifth voltage potential and the sixth voltage potential may be respectively provided to the source and the drain of the transistor T through the first power line PL1 and the second power line PL2. In some embodiments, the first voltage difference provided to the anti-fuse structure AF may be smaller than its break down voltage, for example, the first voltage difference may be about 1V, such that the first voltage difference would not change the state of the corresponding anti-fuse structure AF. By detecting the second current drop caused by the body effect to determine whether the anti-fuse structure AF is blown out (or determine the state of the anti-fuse structure AF), the data can be read out from the memory cell 100 accordingly.

Figure 4:
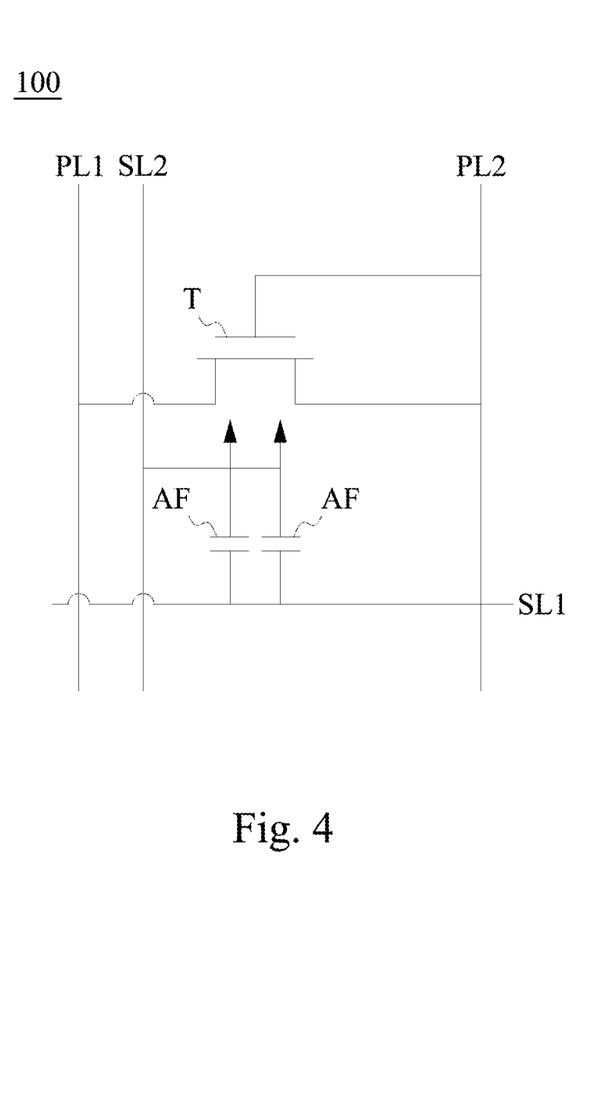
FIG. 4 is a layout of the memory cell shown in FIG. 1 according to some other embodiments of the present disclosure.

FIG. 4 is a layout of the memory cell 100 shown in FIG. 1 according to some other embodiments of the present disclosure. Reference is made to FIG. 4. The layout of the memory cell 100 shown in FIG. 4 includes two anti-fuse structures AF electrically connected in parallel, such that the mis-operation of the memory cell 100 due to the malfunction of any of the anti-fuse structures AF can be prevented. Although not illustrated herein, more than two anti-fuse structures AF can be electrically connected in parallel in the memory cell 100.

Figure 5:
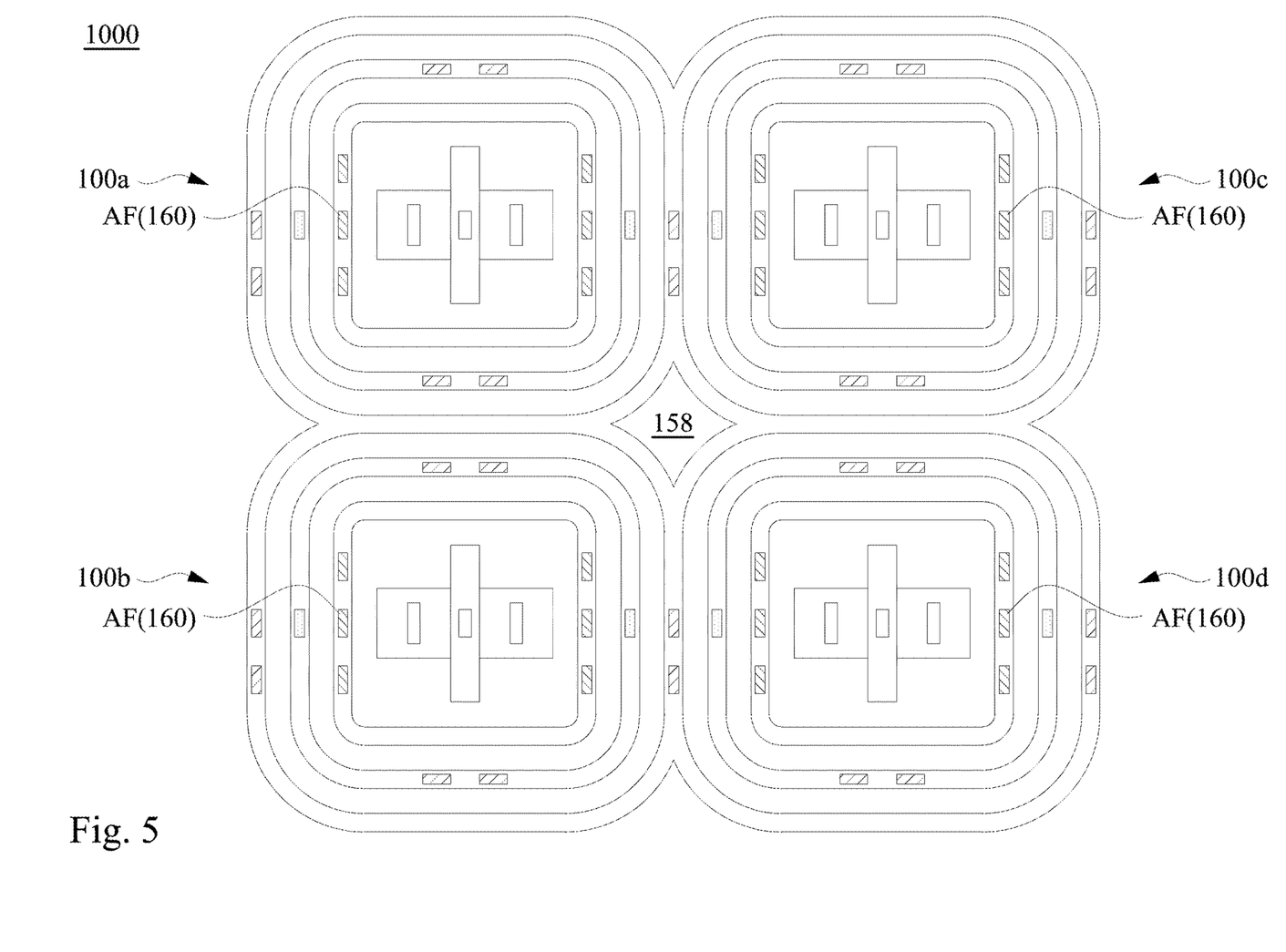
FIG. 5 is a top view illustrating a memory device including multiple memory cells shown in FIG. 1.
Figure 6:
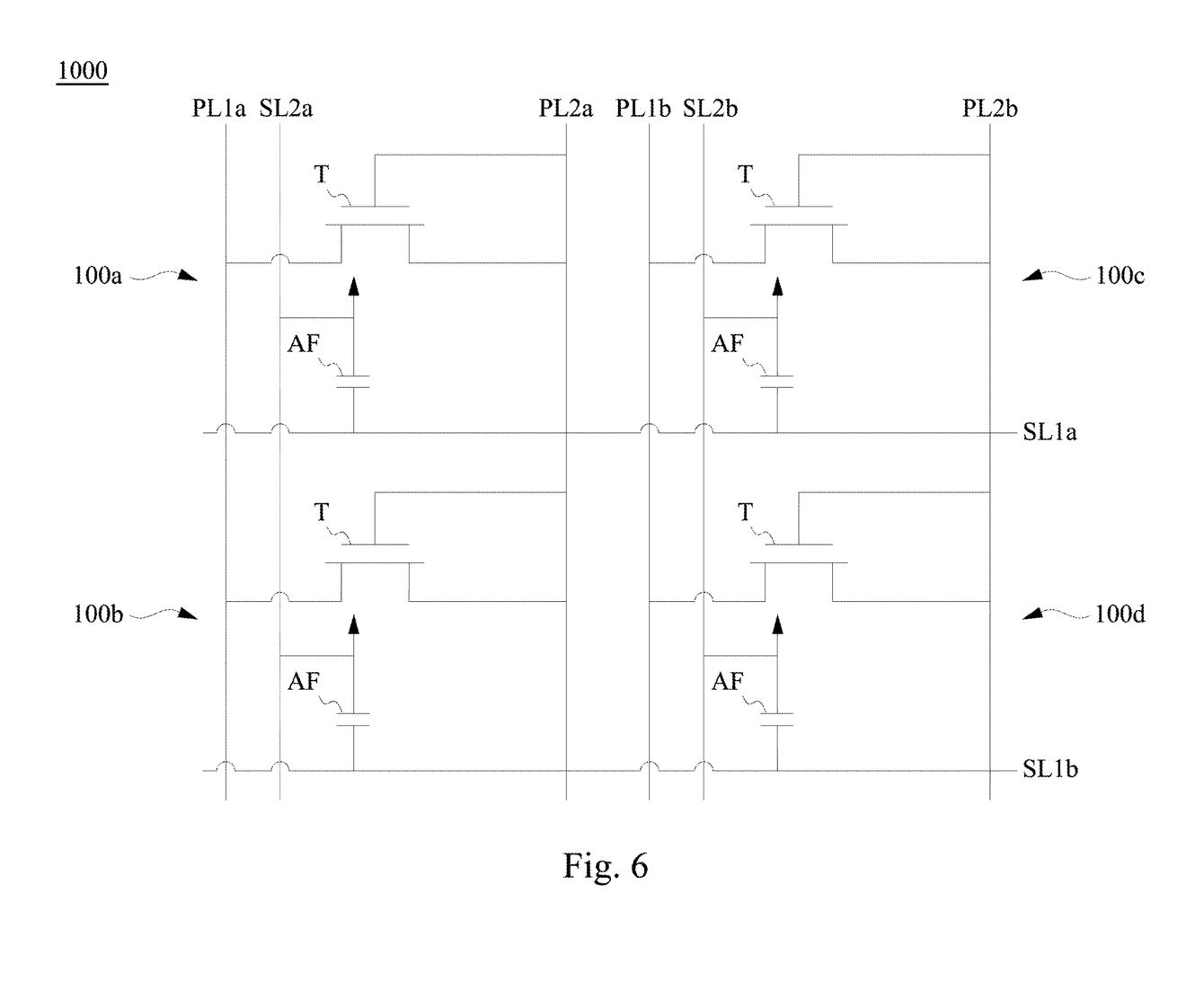
FIG. 6 is a layout of the memory device shown in FIG. 5 according to some embodiments of the present disclosure.

FIG. 5 is a top view illustrating a memory device 1000 including multiple memory cells 100 shown in FIG. 1. FIG. 6 is a layout of the memory device 1000 shown in FIG. 5 according to some embodiments of the present disclosure. Reference is made to FIG. 5 and FIG. 6. The memory device 1000 includes a plurality of the memory cells 100 (e.g., the memory cells 100a-100d) arranged in matrix, such that a high density memory device 1000 can further be achieved. In addition, since a plurality of the memory cells 100 are arranged in matrix, the first power line PL1, the second power line PL2, the first signal line SL1, and the second signal line SL2 can be shared by the memory cells 100. For example, the first power line PL1a can be shared by the memory cells 100a and 100b, the second power line PL2a can be shared by the memory cells 100a and 100b, the first signal line SL1a can be shared by the memory cells 100a and 100b, and the second signal line SL2a can be shared by the memory cells 100a and 100c. For another example, the first power line PL1b can be shared by the memory cells 100c and 100d, the second power line PL1b can be shared by the memory cells 100c and 100d, the first signal line SL1b can be shared by the memory cells 100c and 100d, and the second signal line SL2b can be shared by the memory cells 100b and 100d. As shown in FIG. 5, the third ring R3 including the second doping region 140 and the third conductive contact 180 may also be shared by the adjacent memory cells 100.

In some embodiments, when the break down voltage of each of the anti-fuse structures AF in the memory cells 100a-100d is about 3V, and the anti-fuse structure AF of the memory cell 100a is predetermined to be blown out, a voltage potential provided through the first signal line SL1a may be about −5V, a voltage potential provided through the first signal line first signal line SL1b may be about −1V, a voltage potential provided through the second signal line SL2a may be about 0V, and a voltage potential provided through the second signal line SL2b may be about −3V. Accordingly, a voltage difference between the first terminal and the second terminal of the anti-fuse structure AF of the memory cell 100a is about 5V, which is higher than its break down voltage, resulting in the blowing out of anti-fuse structure AF of the memory cell 100a. On the other hand, since a voltage difference between the first terminal and the second terminal of the anti-fuse structures AF of the memory cells 100b-100d are about 1V, 2V, and 2V, respectively, the anti-fuse structures AF of the memory cells 100a-100c are not blown out.

In some embodiments, when determine which anti-fuse structure AF is blown out, voltage potential provided through the first signal lines SL1a and SL1b may respectively be about −1V, and voltage potential provided through the second signal lines SL2a and SL2b may respectively be about 0V, such that current may flow through the anti-fuse structure AF which has been blown out, and the data can be read out from the memory device 1000 due to the body effect.

According to the aforementioned embodiments of the present disclosure, since the third doping region, the first conductive contact, and the dielectric layer therebetween can be configured as the capacitor (i.e., the anti-fuse structure) of the memory cell, the size of the memory cell can be decreased, and the number of the capacitors in a single semiconductor device (e.g., a memory device with multiple memory cells) can be increased without occupying a large area. Accordingly, a high density semiconductor device can be achieved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A memory cell, comprising:
   a semiconductor substrate;
   a transistor above the semiconductor substrate; and
   a first anti-fuse structure above the semiconductor substrate and adjacent to the transistor, comprising:
      a first terminal in the semiconductor substrate and laterally surrounding the transistor; and
      a second terminal above and spaced apart from the first terminal of the first anti-fuse structure.

2. The memory cell of claim 1, wherein a dielectric layer is between the first terminal and the second terminal of the first anti-fuse structure.

3. The memory cell of claim 1, wherein a distance between a top surface of the first terminal and a bottom surface of the second terminal is between about 15 Å and about 30 Å.

4. The memory cell of claim 1, further comprising an isolation structure laterally surrounding the transistor.

5. The memory cell of claim 4, wherein the isolation structure is in contact with the first terminal of the first anti-fuse structure and one of a source and a drain of the transistor.

6. The memory cell of claim 4, wherein the first terminal of the first anti-fuse structure laterally surrounds the isolation structure.

7. The memory cell of claim 1, further comprising a well region in the semiconductor substrate, wherein the well region is in contact with the first terminal of the first anti-fuse structure and a channel of the transistor.

8. The memory cell of claim 1, wherein a top surface of the first terminal of the first anti-fuse structure is lower than a top surface of a gate of the transistor.

9. The memory cell of claim 1, wherein a bottom surface of the second terminal of the first anti-fuse structure is lower than a top surface of a gate of the transistor.

10. The memory cell of claim 1, further comprising a contact interconnecting a gate and a drain of the transistor.

11. The memory cell of claim 1, further comprising a first doping region in the semiconductor substrate and laterally surrounding the first terminal of the first anti-fuse structure, and the first doping region is spaced apart from the first terminal of the first anti-fuse structure.

12. The memory cell of claim 11, wherein the first doping region has a conductivity type the same as a conductivity type of the first terminal of the first anti-fuse structure.

13. The memory cell of claim 11, further comprising a second doping region in the semiconductor substrate and laterally surrounding the first doping region, and the first doping region has a conductivity type different from a conductivity type of the second doping region.

14. The memory cell of claim 1, further comprising a second anti-fuse structure above the semiconductor substrate and adjacent to the transistor, wherein the first and second anti-fuse structures share the first terminal.

15. The memory cell of claim 14, wherein the second anti-fuse structure further comprises a second terminal above the first terminal, and the second terminals of the first and second anti-fuse structures are spaced apart from each other.

16. The memory cell of claim 1, wherein the first terminal of the first anti-fuse structure is ring-shaped in a top view.

* * * * *